United States Patent
Stojanovic et al.

(10) Patent No.: US 9,525,426 B2
(45) Date of Patent: Dec. 20, 2016

(54) CROSS-COUPLED INPUT VOLTAGE SAMPLING AND DRIVER AMPLIFIER FLICKER NOISE CANCELLATION IN A SWITCHED CAPACITOR ANALOG-TO-DIGITAL CONVERTER

(71) Applicant: Infineon Technologies AG, Neubiberg (DE)

(72) Inventors: Snezana Stojanovic, Wernberg (AT); Patrizia Greco, Villach (AT); Elmar Bach, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/615,001

(22) Filed: Feb. 5, 2015

(65) Prior Publication Data
US 2016/0233874 A1  Aug. 11, 2016

(51) Int. Cl.
| | | |
|---|---|---|
| H03M 1/08 | (2006.01) | |
| H03M 1/12 | (2006.01) | |
| H03M 3/00 | (2006.01) | |
| H03K 17/10 | (2006.01) | |

(52) U.S. Cl.
CPC ........... H03M 1/0836 (2013.01); H03K 17/10 (2013.01); H03M 1/089 (2013.01); H03M 1/1245 (2013.01); H03M 3/368 (2013.01); H03M 3/372 (2013.01); H03M 3/458 (2013.01)

(58) Field of Classification Search
CPC ....................................................... H03M 3/34
USPC ............................. 341/122, 143; 327/94–96
See application file for complete search history.

(56) References Cited

U.S. PATENT DOCUMENTS

| 5,675,334 | A | * | 10/1997 | McCartney | ............. | H03M 3/34 |
|---|---|---|---|---|---|---|
| | | | | | | 341/143 |
| 6,411,242 | B1 | * | 6/2002 | Oprescu | ................... | H03M 3/34 |
| | | | | | | 341/143 |
| 6,650,263 | B1 | * | 11/2003 | Dillon | .................. | G11C 27/024 |
| | | | | | | 327/96 |
| 6,809,672 | B2 | | 10/2004 | Gupta | | |
| 7,167,119 | B1 | * | 1/2007 | Lei | ......................... | H03M 3/342 |
| | | | | | | 341/143 |
| 7,683,815 | B2 | | 3/2010 | Josefsson et al. | | |

(Continued)

OTHER PUBLICATIONS

McCartney et al, A Low-Noise Low-Drift Transducer ADC, IEEE Journal of Solid-State Circuits, vol. 32, No. 7, Jul. 1997.*

(Continued)

Primary Examiner — Howard Williams
(74) Attorney, Agent, or Firm — Eschweiler & Associates, LLC

(57) ABSTRACT

A switching component comprises a plurality of switches configured to receive a differential signal at an input and is configured to provide a non-inverted version of the differential signal at an output during a first phase of operation and an inverted version of the differential signal at an output during a second phase of operation. A driver amplifier component is configured to receive the non-inverted version of the differential signal at an input during the first phase of operation and the inverted version of the differential signal at an input during the second phase of operation. A sampling capacitor component is configured to sample the output of the driver amplifier component during the first phase of operation and the second phase of operation.

16 Claims, 9 Drawing Sheets

(56) References Cited

U.S. PATENT DOCUMENTS

2016/0037108 A1* 2/2016 Tokunaga ........... H03M 1/1245
341/122

OTHER PUBLICATIONS

Fujimori, A Single-Chip Stereo Audio Delta-Sigma A/D Converter with 117 dB Dynamic Range, IEICE Transaction Fundamentals, vol. E83-A, No. 2, Feb. 2000.*
Fujimori; "A Single-Chip Stereo Audio Delta-Sigma A/D Converter with 117dB Dynamic Range"; IEICE Trans. Fundamentals, vol. E83-A, No. 2, Feb. 2000, p. 243-251.
Min Gyu Kim, et al.; "A 0.9 V 92 dB Double-Sampled Switched-RC Delta-Sigma Audio ADC"; IEEE Journal of Solid-State Circuits, vol. 43, No. 5, May 2008, p. 1195-1206.
James Karki; "Fully-Differential Amplifiers"; Texas Instruments Application Report; SLOA054D—Application Report, Jan. 2002; p. 1-28.
Berglund, et al.; "On the Realization of Switched-Capacitor Integrators for Sigma-Delta Modulators"; Dec. 21, 2007, p. 1-118.
Schreier, et al.; "Understanding Delta-Sigma Data Converters"; IEEE Press, 2005, p. 287 and 293.
Enz, et al.; "Circuit Techniques for Reducing the Effects of Op-Amp Imperfections: Autozeroing, Correlated Double Sampling, and Chopper Stabilization"; Proceedings of the IEEE, vol. 84, No. 11, Nov. 1996, p. 1584-1614.

* cited by examiner

CROSS-COUPLED INPUT VOLTAGE SAMPLING AND DRIVER AMPLIFIER FLICKER NOISE CANCELLATION IN A SWITCHED CAPACITOR ANALOG-TO-DIGITAL CONVERTER

FIELD

The present disclosure relates to switched capacitor systems and, in particular, to cross-coupled input voltage sampling and driver amplifier flicker noise cancellation in switched capacitor analog to digital converter (ADC).

BACKGROUND

Advancement in modern technology has led to an increased number of digital applications and thereby to an increased demand for analog-to-digital converters (ADCs). Delta sigma ($\Sigma\Delta$) ADCs have the advantage of offering high resolution among the various types of ADCs. $\Sigma\Delta$ ADCs comprise a switched capacitor integrator as its first stage in order to sample the input signal. One of the main limitations of the performance of switched capacitor circuits is noise, such as thermal noise. In switched capacitor systems, this thermal noise (e.g., thermal KT/C noise) limits the accuracy of the sampling circuit. Further, in some applications $\Sigma\Delta$ ADCs include a driver amplifier, which generates flicker noise associated with it that further degrades the performance of the $\Sigma\Delta$ ADCs. Therefore, it is desirable for a switched capacitor system to operate with low thermal noise and low flicker noise.

SUMMARY

The following presents a simplified summary of the specification in order to provide a basic understanding of some aspects being described. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

In one embodiment of the disclosure, a switched capacitor system comprises a switching stage comprising a plurality of switches configured to receive a differential signal at an input of the switching stage and provide a non-inverted version of the differential signal at an output of the switching stage during a first phase of operation and an inverted version of the differential signal at the output of the switching stage during a second phase of operation. The switched capacitor system further comprises a driver stage comprising an amplifier, located downstream of the switching stage, configured to receive the non-inverted version of the differential signal at an input of the driver stage during the first phase of operation and the inverted version of the differential signal at the input of the driver stage during the second phase of operation. A sampling capacitor stage is configured to sample an output of the driver stage during the first phase of operation and the second phase of operation and provide a cancellation of a flicker noise and an offset of the driver stage during the second phase of operation. In addition, the switched capacitor system comprises a switching controller configured to control a cross-coupled configuration of the plurality of switches and increase a signal-to-noise ratio of the sampling capacitor stage by approximately doubling a transferred charge and corresponding signal swing across the sampling capacitor stage.

In another embodiment of the disclosure, an analog to digital converter system, comprises a switching component configured to receive a differential signal at a first signal branch and a second signal branch, comprising a first set of switches configured to provide a non-inverted version of the differential signal at an output of the switching component during a first phase of operation, and a second set of switches configured to provide an inverted version of the differential signal at the output of the switching component during a second phase of operation. The analog to digital converter system further comprises a driver component configured to generate a drive signal to the first signal branch and the second signal branch based on the non-inverted version of the differential signal during the first phase of operation and based on the inverted version of the differential signal during the second phase of operation. A sampling component is configured to sample the drive signal of the driver component, generate a charge transfer to a first sampling capacitor and a second sampling capacitor during the first phase of operation and the second phase of operation, and generate a cancellation of a flicker noise and an offset of the driver component during the second phase of operation. In addition the analog to digital converter system comprises a switching control component configured control a cross-coupled configuration of the first set of switches and the second set of switches and increase a signal-to-noise ratio of the sampling component by approximately doubling a charge transfer and corresponding signal swing across the first sampling capacitor and the second sampling capacitor.

In another embodiment of the disclosure, a method for an analog to digital converter comprises receiving an analog differential signal, sampling a first portion of the analog differential signal at a first sampling capacitance in a first phase of operation, and generating a first charge transfer to the first sampling capacitance. The method further includes sampling a second portion of the analog differential signal, comprising an inverted version of the first portion of the differential signal at the first sampling capacitance in a second phase of operation, and generating a second charge transfer to the first sampling capacitance and providing, via a first amplifier, the first portion and the second portion of the analog differential signal prior to the first charge transfer and the second charge transfer to the first sampling capacitance. The method further comprises sampling the second portion of the analog differential signal at a second sampling capacitance in the first phase of operation, and generating a first charge transfer to the second sampling capacitance, sampling the first portion of the analog differential signal, comprising an inverted version of the second portion of the analog differential signal at the second sampling capacitance in the second phase of operation, and generating a second charge transfer to the second sampling capacitance and providing, via a second amplifier, the second portion and the first portion of the analog differential signal prior to the first charge transfer and the second charge transfer to the second sampling capacitance.

BRIEF DESCRIPTION OF THE DRAWINGS

In the following, the disclosure will be further explained and described by means of specific example embodiments with reference to the enclosed drawings.

DETAILED DESCRIPTION

Figure 1:
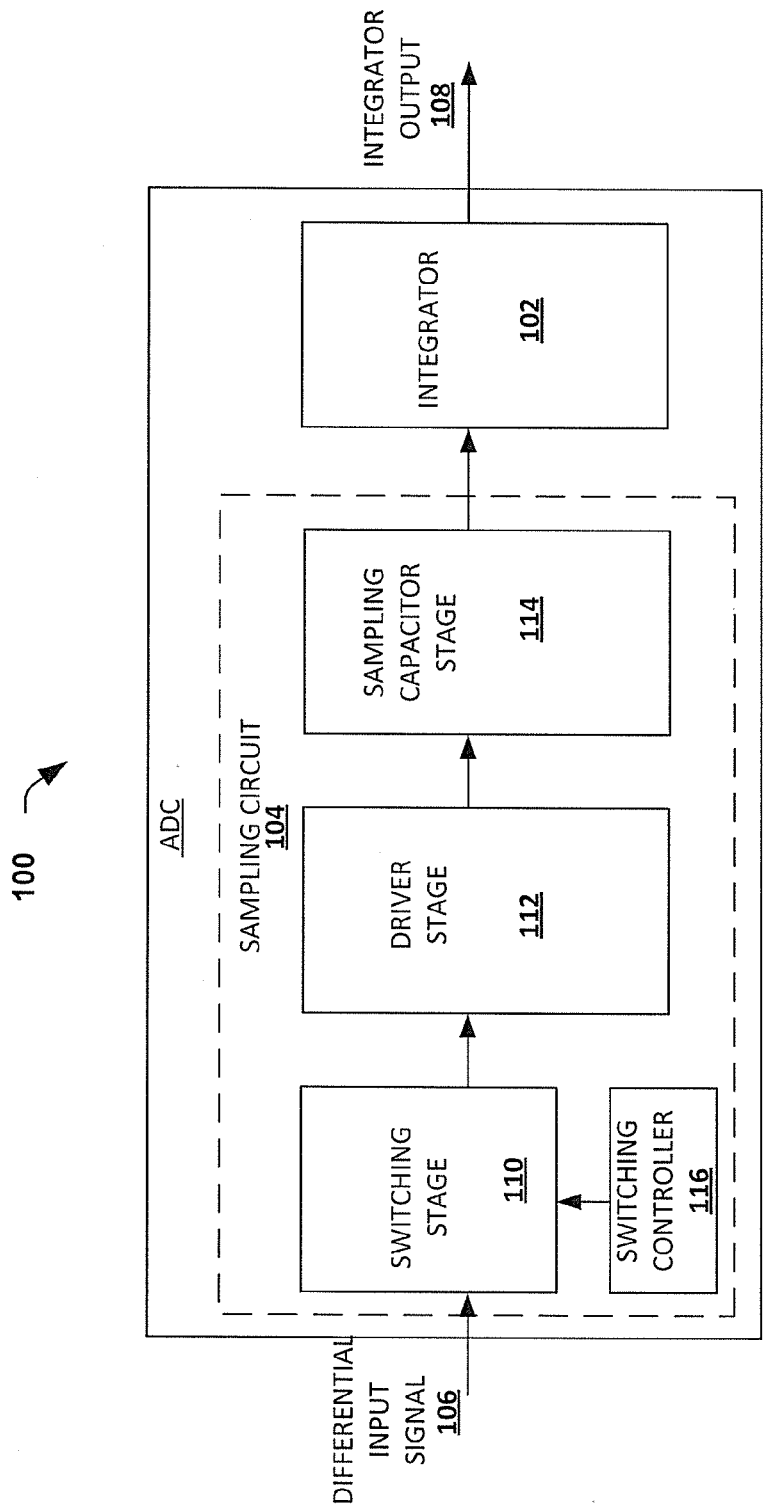
FIG. 1 illustrates a block diagram of a ADC with a sampling circuit and an integrator according to one embodiment of the disclosure.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

This disclosure is directed towards a cross-coupled input voltage sampling and driver amplifier flicker noise cancellation in switched capacitor ADCs. Delta-sigma conversion is a method that is used when high resolution is desired. ADC comprises an integrator having a switched capacitor sampling circuit as a first stage of operation. Further, ADC includes a driver amplifier in order to provide isolation of the signal source from the sampling circuit and provide a low impedance drive for the sampling circuit. However, switched capacitor systems are subject to noise, which limits the accuracy of the sampling circuit.

At least two noise effects associated with switched capacitor ADCs can include thermal noise and flicker noise of the driver amplifier. Thermal noise is the electronic noise generated by the thermal agitation of the charge carriers (usually the electrons) inside an electrical conductor at equilibrium, which happens regardless of the applied voltage. The thermal noise on a sampling capacitor is inversely proportional to the capacitor value (KT/C noise). In order to provide low noise performance, the capacitor value can be made sufficiently high. However, large capacitors can degrade the speed of the circuit and increase the area. In addition, flicker noise, a type of electronic noise dominant in the low frequency range, can be caused by charge carriers getting trapped and later released as they move in a channel of transistors.

To provide a solution for reducing the thermal noise and flicker noise associated with switched capacitor sampling circuits, one example architecture of the sampling circuit provides an implementation of cross-coupled input voltage sampling and driver amplifier flicker noise cancellation. In some embodiments, the sampling circuit enables a reduction of the flicker noise and an offset of the driver amplifiers.

Cross-coupled input voltage sampling operates to reduce the effect of thermal noise by increasing the effective sampling charge across sampling capacitors, thereby obtaining improved signal to noise performance for a given capacitor value. For example, in a switched capacitor sigma delta ADC, a sampling circuit of a first integrator can sample the input signal in both φ1 and φ2 phases (sampling and integration) in order to double the amount of charge transferred to an integration capacitor during an integration phase. In one embodiment, a fully differential circuit with a differential input signal performs sampling of the input signal in both φ1 and φ2 phases by using a cross-coupled switching circuit, which samples the differential input with opposite polarities in the two phases φ1 and φ2. This cross-coupled sampling doubles the effective voltage swing across the sampling capacitors, thereby doubling the sampled charge and the sampled signal power during the integration phase, while the thermal noise remains the same. This technique improves the SNR performance of the sampling circuit.

FIG. 1 depicts an example ADC 100, according to the present disclosure, comprising an integrator 102 having a sampling circuit 104. The ADC 100 receives a differential input signal 106 at the input of the sampling circuit 104, which is configured to sample the differential input signal 106 at a particular sampling frequency. The sampling circuit 104 further comprises a switching stage 110 configured to receive the differential input signal 106 at its input, a driver stage 112 located downstream of the switching stage 110, a sampling capacitor stage 114 located downstream of the driver stage 112 and a switching controller 116 configured to control a configuration of the switching stage 110. The sampling frequency is greater than or equal to the Nyquist frequency, which is twice the frequency of the differential input signal 106. During a sampling phase, the sampling circuit 104 samples the differential input signal 106. During an integration phase, the sampled differential input signal is transferred to the integrator 102, which generates an output signal 108 proportional to the integral of the sampled differential input signal.

The switching stage 110, for example, can comprise different switching components such as a plurality of switches, transistors, or other switching devices, for example, in order to generate switching patterns or operations. The switching stage 110 can define a point in time or phase(s) of operation based on switching configurations. The switching stage 110 of the switching circuit 104 can operate to receive the differential input signal 106 at different signal branches or at different signal chains or pathways, such as a first signal branch and a second signal branch of an input of the switching stage. In one embodiment, the switching stage 110 of the sampling circuit 104 can provide a non-inverted version of the differential input signal 106 at an output of the switching stage 110, which can be performed during a first phase of operation. In addition, the switching stage 110 can operate to provide an inverted version of the differential input signal 106 at the output of the switching stage 110 during a second phase of operation. For example, in the first phase of operation, the switching stage 110 can configure a first set of switches (not shown) to be turned on, activated, or in a configuration or state that is a first configuration among various different configurations, for example. Concurrently or at the same time, the switching stage 110 can configure a second set of switches to be turned off, inactivated or in a second different state or configuration than the first state of configuration.

Additionally or alternatively, the switching stage 110 can operate in a second phase of operation that is different from the first phase of operation. For example, a second set of switches (now shown) can be turned on, activated or in a third state, while the first set of switches are turned off or inactivated in a fourth state.

The switching stage 110 operates to alter the states or configuration of the sampling circuit along one or more signal branches and to provide a first set of control signals to the driver stage 112 in a first state or first configuration and a second set of output signals or control signals in a second state or second configuration. The control signals, for example, can be different from one another based on the different switching states generated by the switching stage 110 (e.g., different polarities, inversions, frequencies, or the other parameter difference). In addition or alternatively, the control signals provided to the driver stage 112 can be single ended signals or differential signals, for example.

In addition, the different configurations generated by the switching stage 110 can be configured or dynamically structured based on the differential input signal 106 and a control signal derived from the switching controller 116. The switching stage 110 can operate to generate the different configurations or states among different signal pathways, branches or signal chains as the first and second configurations or stages, or generate the different configurations or states within individual signal branches or pathways independently of one another. For example, the switching stage 110 can generate the first configuration by cross-coupling two or more signal pathways coupled to the driver stage 112 or other components within the sampling circuit 104, and generate the second configuration within each signal pathway without cross-coupling branches or pathways of signal communication.

The driver stage 112 is located downstream of the switching stage 110 and is configured to receive the output of the switching stage 110 during the first phase of operation and the second phase of operation. For example, a first output of the switching stage 110 can be received during the first phase of operation and comprise a first signal or a first switching signal that is derived from the first switching state of the switching stage 110. A second output of the switching stage 110 can be received by the driver stage 112 during the second phase of operation and comprise a second output signal or a first switching signal of the switching stage 110. In one aspect, the driver stage 112 can comprise one or more amplifiers (e.g., drivers, buffers etc.) that generate a driver output to drive or bias one or more components of the sampling capacitor stage 114.

The driver stage 112 further operates to provide an isolation of the signal source (i.e. the differential input signal 106) from the sampling capacitor stage 114. The driver stage 112 can also generate a low impedance drive for the sampling circuit 104, which can be derived from or operate based on the controls signals received from the switching stages as a function of the different phases of operation (the first phase and the second phase). The driver stage 112 can be further configured to process a differential signal or other signal as the output signals from the switching stage 110 during the different phases (the first phase of operation and the second phase of operation) received at its input. In addition, the driver stage 112 provides the different inversions of the processed signals with a driver signal or other amplifier signal. For example, the driver stage 112 can generate a voltage source signal while providing the non-inverted version of the differential signal 106 at its output during the first phase of operation and the inverted version of the differential input signal 106 at its output during the second phase of operation. As such, the driver stage 112 drives a driver signal or a bias signal to the sampling capacitor stage 114 with the different inversions of the switching stage output 110.

In one embodiment, the driver stage 112 can comprise one or more drivers, buffer amplifiers, or other driver circuits, which can provide driver signals with the inverted and non-inverted versions of the outputs of the switching stage 110 along one or more different signal branches or pathways. For example, a first driver amplifier (not shown) on a first signal branch or pathway (not shown) can be configured to receive the differential signal at the first signal branch of the output of the switching stage 110 and a second driver amplifier on the second signal branch can be configured to receive the differential signal at the second signal branch of the output of the switching stage 110. The first driver amplifier and the second driver amplifier can be, for example, amplifiers with a single input terminal and a single output terminal, or can comprise multiple different input terminal or output terminals respectively.

In another embodiment, for example, the driver stage 112 can comprise a fully differential amplifier with two inputs and two outputs. The two inputs of the driver stage 112 comprises a first driver input configured to receive the differential signal at the first signal branch of the output of the switching stage 110 and a second driver input configured to receive the differential signal at the second signal branch of the output of the switching stage 110. The two outputs of the driver stage 112 comprises a first driver output configured to provide a drive signal to the first signal branch and a second driver output configured to provide a drive signal to the second signal branch.

The sampling capacitor stage 114 is located downstream of the driver stage 112 and is configured to receive the drive signal from the driver stage 112. In one embodiment, the sampling capacitor stage 114 comprises a first sampling capacitor configured to sample the drive signal on the first signal branch at the output of the driver stage 112 during the first phase of operation and the second phase of operation. Additionally, the sampling capacitor stage 114 comprises a second sampling capacitor configured to sample the drive signal on the second signal branch at the output of the driver stage 112 during the first phase of operation and the second phase of operation.

The integrator 102 is located downstream of the sampling capacitor stage 114 and can comprise a fully differential integrator having two inputs and two outputs. The fully differential integrator, according to one embodiment, comprises a first integrating capacitor configured to integrate a sampled voltage across the first sampling capacitor during the second phase of operation. The fully differential integrator further comprises a second integrating capacitor configured to integrate a sampled voltage across the second sampling capacitor during the second phase of operation.

The switching controller 116 is coupled to the switching stage 110 and is configured to control the configuration of the plurality of switches in the switching stage 110. The switching controller 116 provides a non-overlapping clock scheme and can be implemented with hardware/software or both. In one embodiment, the switching controller 116 operates to turn on or activate a first switching configuration or state in the switching stage 110, such as with a first set of switches or switching components, for example. As such, the switching controller 116 can adjust the switching stage 110 to operate in the first phase of operation and generate a first charge transfer to the sampling capacitor stage 114, which can comprise, for example, one or more capacitors or capacitor components, such as a first sampling capacitor and a second sampling capacitor. Further, the switching controller 116 can operate to turn on or activate the switching stage 110 to operate in the second switching configuration or state, such as with a second set of switches or switching components of the switching stage 110. The switching controller 116 can also activate the switching stage 110 to operate in a second phase of operation to generate a second charge transfer to the sampling capacitor stage 114. The different charge transfers, the first and the second charge transfer, for example, can be derived from input signals of different configurations or stages, which can generate different inversions of the input signals and different cross couplings depending upon the phase and configurations being generated by the switching stages and the driver stage 112. The switching controller 116 thus can operate to alternate or sequence the different phases (e.g., the first phase and the second phase of operation), such as to generate different charges for storage and subsequent sampling in one or more capacitor components, such as with a first sampling capacitor or a second sampling capacitor.

In response, a non-inverted version of the differential input signal 106 can be sampled onto the first sampling capacitor and the second sampling capacitor during the first charge transfer, and the inverted version of the differential input signal 106 can be sampled onto the first sampling capacitor and the second sampling capacitor during the second charge transfer. Because the differential input signal 106 can be sampled on to the first sampling capacitor and to the second sampling capacitor with opposite polarities during the first phase of operation and the second phase of operation respectively, the sampling circuit 104 operates to increase, or approximately double, a sampling charge to the sampling capacitor stage 114, such as to one or more sampling capacitors (e.g., a first sampling capacitor and the second sampling capacitor). The sampling circuit 104 is configured to increase the signal-to-noise ratio of the sampling capacitor stage 114 by a factor of approximately two, for example.

The driver stage 112 further operates to provide the differential input signal 106 to the sampling capacitor stage 114 prior to the first charge transfer and the second charge transfer respectively. A first positive flicker noise and a first offset (e.g., a driver signal mismatch or offset of the output of the amplifiers within the driver stage 112) is introduced into the first charge transfer to the sampling capacitor stage 114 during the first phase of operation. Additionally, a second positive flicker noise and a second offset are introduced into the second charge transfer to the sampling capacitor stage 114 during the second phase of operation. Because the first positive flicker noise and the first offset and the second positive flicker noise and second offset are opposite in polarities, the sampling circuit 104 operates to generate a cancellation of the flicker noise and the offsets, and thereby provide better ADC stability and resolution with a decrease in noise.

Figure 2:
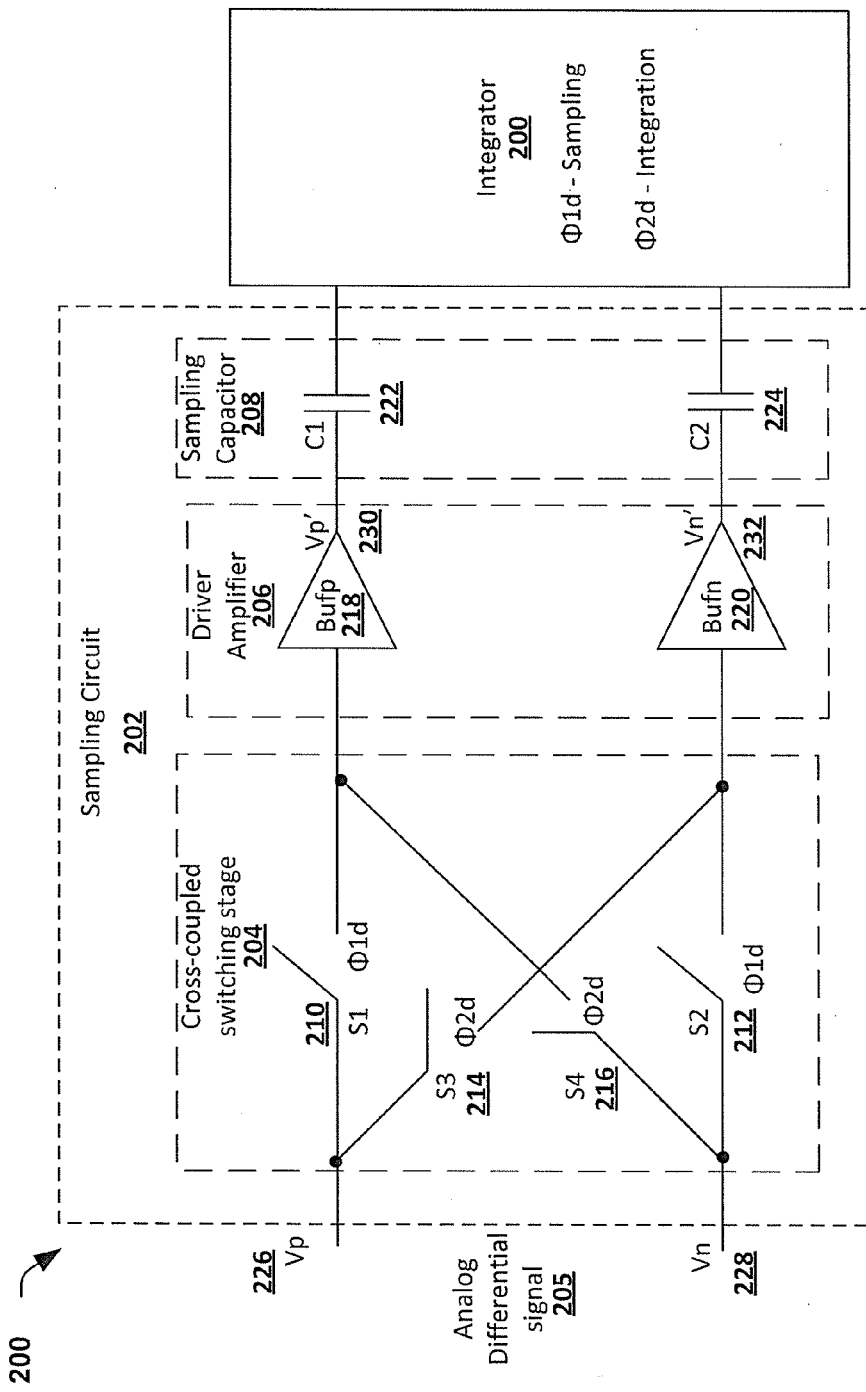
FIG. 2 illustrates a schematic diagram of a sampling circuit of an integrator, according to another embodiment of the disclosure.

FIG. 2 illustrates a particular embodiment wherein a sampling circuit 202 for a fully differential switched capacitor integrator 200 is disclosed. The sampling circuit 202 comprises a cross-coupled switching stage 204 comprising a plurality of switches 210, 212, 214 and 216 configured to receive an analog differential signal 205 at its input and configured to provide a non-inverted version of the differential signal at its output during a first phase of operation and an inverted version of the differential signal at its output during a second phase of operation. Additionally, the sampling circuit 202 comprises a driver amplifier stage 206 located downstream of the cross-coupled switching stage 204 and configured to receive the non-inverted version of the differential signal at its input during the first phase of operation and the inverted version of the differential signal at its input during the second phase of operation. Furthermore, the sampling circuit 202 comprises a sampling capacitor stage 208 downstream of the driver amplifier stage 206 configured to sample the output of the driver amplifier stage 206 during the first phase of operation and the second phase of operation.

The driver amplifier stage 206 of FIG. 2 further comprises a first driver amplifier 218 downstream of a first branch of the cross-coupled switching stage 204 and a second driver amplifier 220 downstream of a second branch of the cross-coupled switching stage 204. Additionally, the sampling capacitor stage 208 comprises a first sampling capacitor 222 coupled to the output of the first driver amplifier 218 and a second sampling capacitor 224 coupled to the output of the second driver amplifier 220.

Furthermore, the cross-coupled switching stage 204 of FIG. 2 comprises a first switch 210 between the first input 226 of the analog differential signal 205 and an input of the first driver amplifier 218, and a second switch 212 between the second input 228 of the analog differential signal 205 and an input of the second driver amplifier 220. The cross-coupled switching stage 204 further comprises a third switch 214 between the first input 226 of the analog differential signal 205 and an input of the second driver amplifier 220, and a fourth switch 216 between the second input 228 of the analog differential signal 205 and an input of the first driver amplifier 218, wherein the third switch 214 and the fourth switch 216 operate to cross-couple the first input 226 of the analog differential signal 205 and the second input 228 of the analog differential signal 205 to the second driver amplifier 220 and the first driver amplifier 218.

In one embodiment, the cross-coupled switching stage 204 is configured, in the first phase of operation, to turn on the first switch 210 and the second switch 212, while the third switch 214 and the fourth switch 216 are turned off. Further, in the second phase of operation, the cross-coupled switching stage 204 is configured to turn on the third switch 214 and the fourth switch 216, while the first switch 210 and the second switch 212 are turned off.

Figure 3:
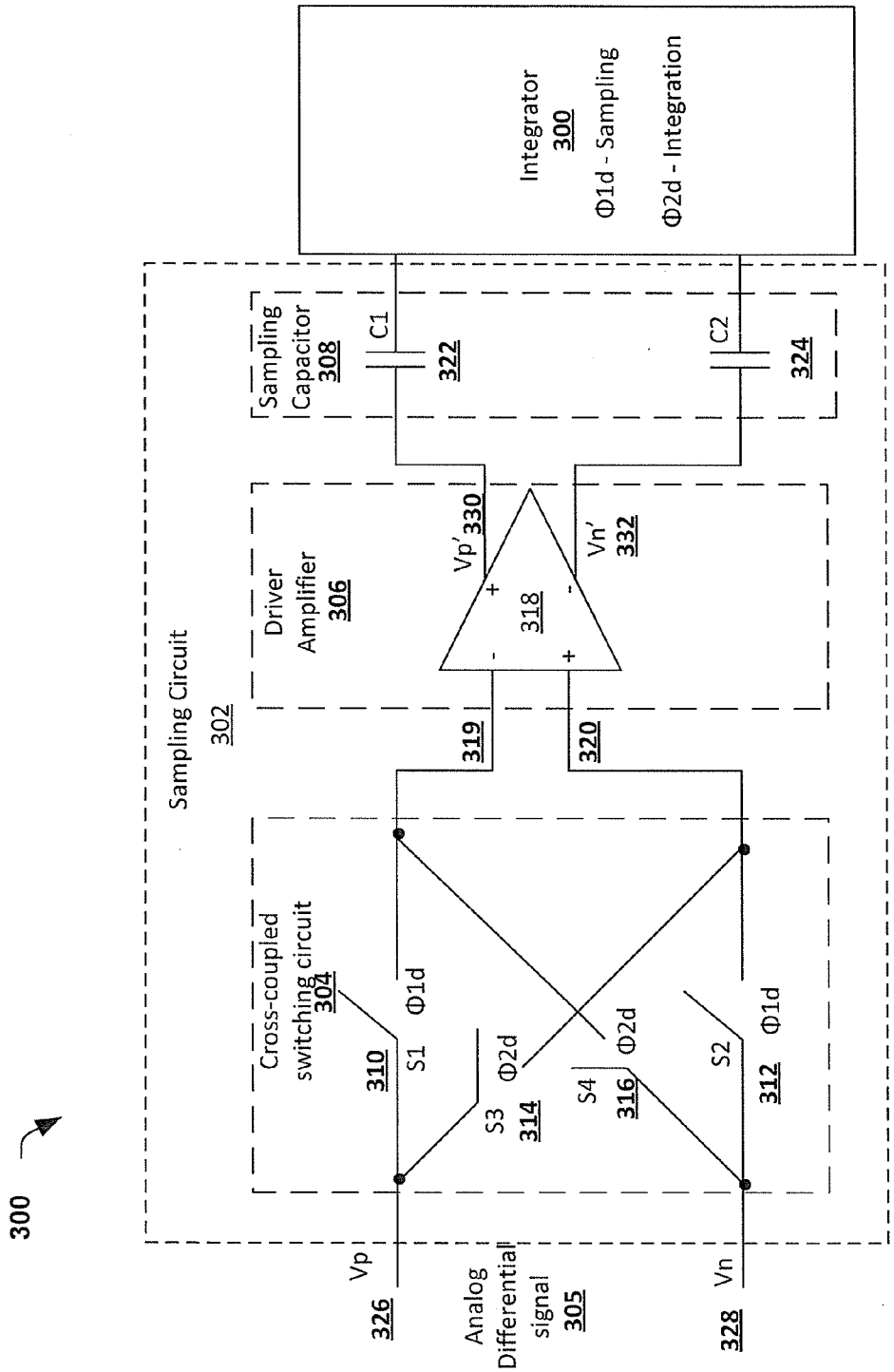
FIG. 3 illustrates another schematic diagram of a sampling circuit of an integrator with a fully differential buffer amplifier, according to another embodiment of the disclosure.

FIG. 3 shows another embodiment wherein a sampling circuit 302 for a fully differential switched capacitor integrator 300 is disclosed. The sampling circuit 302 comprises a cross-coupled switching circuit 304 comprising a plurality of switches 310, 312, 314 and 316 configured to receive an analog differential signal 305 at its input and configured to provide a non-inverted version of the differential signal at its output during a first phase and an inverted version of the differential signal at its output during a second phase. Additionally, the sampling circuit 302 comprises a driver amplifier stage 306 located downstream of the cross-coupled switching circuit 304 and configured to receive the non-inverted version of the differential signal at its input during the first phase of operation and the inverted version of the differential signal at its input during the second phase of operation. Furthermore, the sampling circuit 302 comprises a sampling capacitor stage 308 downstream of the driver amplifier stage 306 configured to sample the output of the driver amplifier stage 306 during the first phase of operation and the second phase of operation.

The driver amplifier stage 306 of FIG. 3 comprises a fully differential driver amplifier 318 with its first input 319 coupled to the first branch of the cross-coupled switching circuit 304 and its second input 320 coupled to the second branch of the cross-coupled switching circuit 304. Additionally, the sampling capacitor stage 308 comprises a first sampling capacitor 322 coupled to the first output 330 of the driver amplifier 318 and a second sampling capacitor 324 coupled to the second output 332 of the driver amplifier 318.

Furthermore, the cross-coupled switching circuit 304 of FIG. 3 comprises a first switch 310 between the first input 326 of the analog differential signal 305 and the first input 319 of the driver amplifier 318, and a second switch 312 between the second input 328 of the analog differential signal 305 and a second input 320 of the driver amplifier 318. The cross-coupled switching circuit 304 further comprises a third switch 314 between the first input 326 of the analog differential signal 305 and the second input 320 of the driver amplifier 318, and a fourth switch 316 between the second input 328 of the analog differential signal 305 and the first input 319 of the driver amplifier 318, wherein the third switch 314 and the fourth switch 316 operate to cross-couple the first input 326 and the second input 328 of the analog differential signal 305 to the second input 320 and the first input 319 of the driver amplifier 318.

Figure 4A:
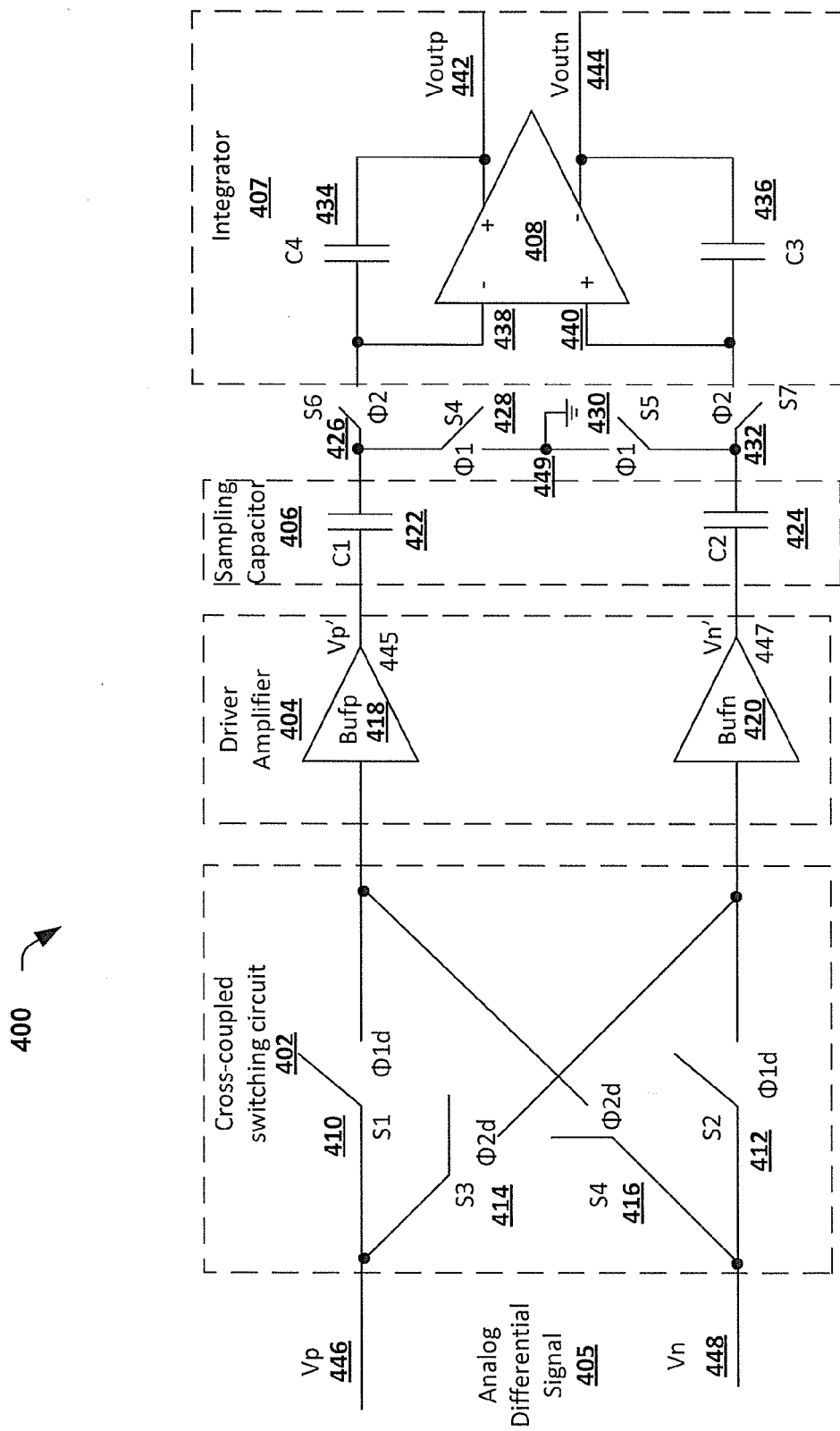
FIG. 4a illustrates another schematic diagram of a fully differential switched capacitor integrator with a sampling circuit, according to another embodiment of the present disclosure.

FIG. 4a shows a schematic diagram of a switched capacitor sampling network 400, according to the present disclosure that could be used as an input circuit for an ADC, such as a ΣΔADC. The network 400 comprises a cross-coupled switching circuit 402 comprising a first switch S1 410 between the first input 446 of the analog differential signal 405 and an input of the first driver amplifier 418, and a second switch S2 412 between the second input 448 of the analog differential signal 405 and an input of the second driver amplifier 420. The cross-coupled switching circuit 402 further comprises a third switch S3 414 between the first input 446 of the analog differential signal 405 and an input of the second driver amplifier 420, and a fourth switch S4 416 between the second input 448 of the analog differential signal 405 and an input of the first driver amplifier 418, wherein the third switch S3 414 and the fourth switch S4 416 operate to cross-couple the first input 446 and the second input 448 of the analog differential signal 405 to the second driver amplifier 420 and the first driver amplifier 418.

Network 400 further comprises a driver amplifier system 404 of comprising a first driver amplifier 418 downstream of a first branch of the cross-coupled switching circuit 402 and a second driver amplifier 420 downstream of a second branch of the cross-coupled switching circuit 402. Additionally, the network 400 comprises a sampling capacitor component 406 comprising a first sampling capacitance C1 422 coupled to the output 445 of the first driver amplifier 418 and a second sampling capacitance C2 424 coupled to the output 447 of the second driver amplifier 420.

Furthermore, the network 400 comprises an integrator 407 comprising an operational amplifier 408 with an inverting terminal 438 and a non-inverting terminal 440. Integrator 407 produces an integrated signal that comprises a positive voltage output signal "Voutp" 442 and a negative voltage output signal "Voutn" 444. A positive voltage integrator feedback capacitor C4 434 is connected in parallel with operational amplifier 408 between 438 and "Voutp" 442. A negative voltage integrator feedback capacitor C3 436 is connected in parallel with operational amplifier 408 between 440 and "Voutn" 444. In addition, the network 400 comprises summing junction switches S4, S5, S6 and S7. Switch S4 428 is disposed between C1 422 and a reference ground. Switch S6 426 is disposed between C1 422 and inverting terminal 438 of the operational amplifier 408. Likewise, switch S5 430 is disposed between C2 424 and a reference ground. Switch S7 432 is disposed between C2 424 and non-inverting terminal 440 of the operational amplifier 408.

Figure 4B:
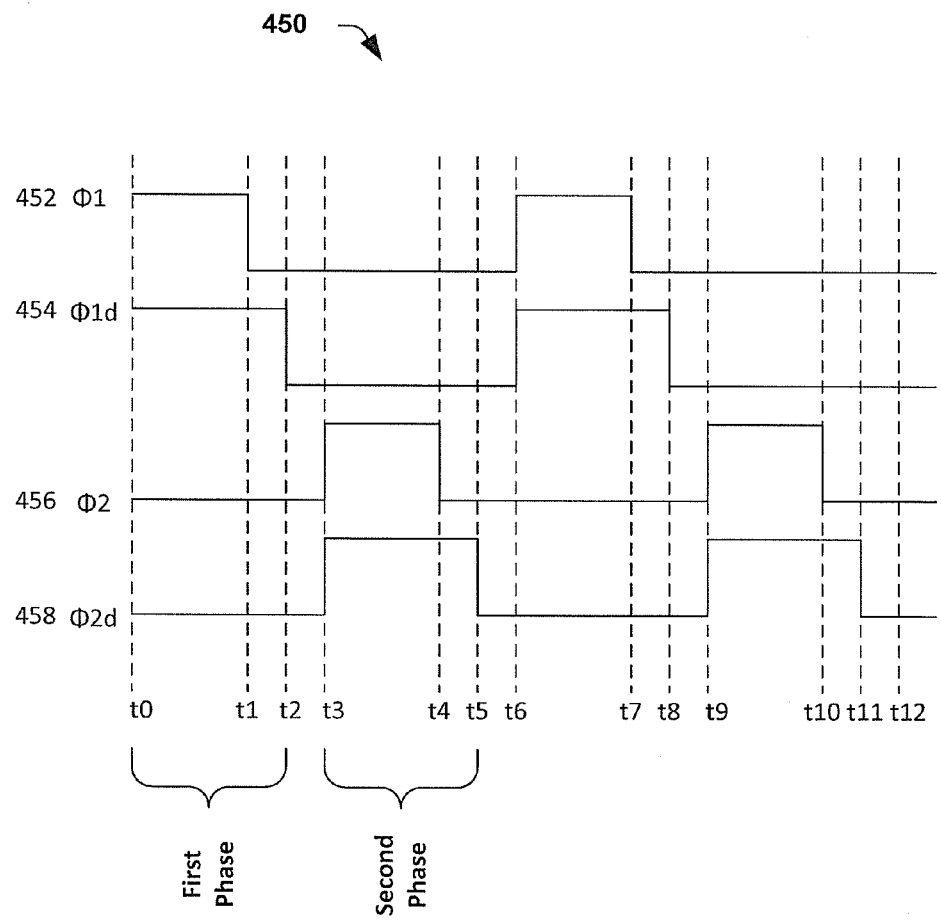
FIG. 4b illustrates an example of a two-phase non-overlapping clock defined by four clock waveforms $\phi1$, $\phi1d$, $\phi2$ and $\phi2d$.

FIG. 4b illustrates a two-phase non-overlapping clock 450 defined by four clock waveforms: "φ1" 452, "φ1d" 454, "φ2" 456 and "φ2d" 458. The position of each switch at any given time is determined by its corresponding clock waveform. In a representative embodiment, a switch is open when its corresponding clock waveform is "off" and a switch is closed when its corresponding clock waveform is "on". However, in other embodiments, the switches could be configured with other relationships between the state of the switches and their corresponding clock waveforms.

Operation of network 400 can be explained by tracing the circuits that are established in response to the cycling of the clock waveforms of the clock 450. At time $t_0$, clock waveforms φ1 452 and φ1d 454 cycle to the on state while the clock waveforms φ2 456 and φ2d 458 remain in the off state. In response to the on state of φ1 452, switches S4 428 and S5 430 close. In response to the on state of φ1d 454, switches S1 410 and S2 412 close. With S1 410 and S4 428 closed, a circuit is established between the first input 446 i.e., Vp and ground 449 through driver amplifier 418 and C1 422. This circuit allows the first input 446 i.e., Vp to be sampled as a charge on C1 422. Further, this circuit samples a flicker noise Vfp of the driver amplifier 418 as a charge on C1 422. Similarly, with S2 412 and S5 430 closed, a circuit is established between the second input 448 i.e., Vn and ground 449 through driver amplifier 420 and C2 424. This circuit allows the second input 448 i.e., Vn to be sampled as a charge on C2 424. Further, this circuit samples a flicker noise Vfn of the driver amplifier 420 as a charge on C2 424.

At time $t_1$, clock waveform φ1 452 cycles to the off state while φ1d 454 remains in the on state. Clock waveforms φ2 456 and φ2d 458 remain in the off state. In response to the off state of φ1 452, switches S4 428 and S5 430 open. Opening switch S4 428 breaks the circuit between the first input 446 i.e., Vp and ground 449. This isolates the charge stored on C1 422, thus effectively sampling the first input 446 i.e., Vp and Vfp. The total charge sampled on capacitance C1 422 at the end of first phase of operation is defined by:

$$Q_{C11} = C_1 \star (Vp + Vfp) \quad (1)$$

Similarly, opening switch S5 430 breaks the circuit between the second input 448 i.e., Vn and ground 449. This isolates the charge stored on C2 424, thus effectively sampling the second input 448 i.e., Vn and Vfn. The total charge sampled on capacitance C2 424 at the end of first phase of operation is defined by:

$$Q_{C21} = C_2 \star (Vp + Vfp) \quad (1)$$

At time $t_2$, clock waveform φ1d 454 cycles to the off state. Clock waveforms φ1 452, φ2 456 and φ2d 458 remain in the off state. In response to the off state of φ1d 454, switches S1 410 and S2 412 open. By delaying the opening of switches S1 410 and S2 412 until after switches S4 428 and S5 430 have been opened, and thus isolating the charges stored on C1 422 and C2 424, the sampled signals are unaffected by the charge injections that occur after switches S4 428 and S5 430 have been opened.

At time $t_3$, clock waveforms φ2 456 and φ2d 458 cycle to the on state while the clock waveforms φ1 452 and φ1d 454 remain in the off state. In response to the on state of φ2d 458, switches S3 414 and S4 416 close. In response to the on state of φ2 456, switches S6 426 and S7 432 close. With switches S6 426 and S4 416 closed, a circuit is established between the second input 448 i.e., Vn and the inverting terminal 438 of the operational amplifier 408 through driver amplifier 418 and C1 422. This circuit allows the second input 448 i.e., Vn and the flicker noise Vfp of the driver amplifier 418 to be sampled as a charge on C1 422 and further enables the total charge $Q_{C1}^+$ on C1 422 to be transferred to C4 434. The transferred charge $Q_{C1}^+$ is defined by:

$$Q_{C1}^+ = C1 \ast ((Vp + Vfp) - (Vn + Vfp)) = C1 \ast (Vp - Vn) \quad (3)$$

Similarly, with switches S7 432 and S3 414 closed, a circuit is established between the first input 446 i.e., Vp and the non-inverting terminal 440 of the operational amplifier 408 through driver amplifier 420 and C2 424. This circuit allows the first input 446 i.e., Vp and the flicker noise Vfn of the driver amplifier 420 to be sampled as a charge on C2 424 and further enables the total charge $Q_{C2}^+$ on C2 424 to be transferred to C3 436. The transferred charge $Q_{C2}^+$ is defined by:

$$Q_{C2}^+ = C2 \ast ((Vn + Vfn) - (Vp + Vfn)) = C2 \ast (Vn - Vp) \quad (4)$$

From the above analysis, it is clear that the cross-coupled sampling doubles the effective voltage swing (i.e., Vp–Vn and Vn–Vp) across the sampling capacitance C1 422 and C2 424 by sampling the differential signal with opposite polarities during the first phase and the second phase, thereby doubling the integrated charge across C4 434 and C3 436, while the thermal noise remains the same. This improves the SNR performance of the sampling circuit. Further, flicker noise Vfp and Vfn of the buffer amplifiers gets sampled on to the sampling capacitance C1 422 and C2 424 with the same polarity during the first phase and the second phase, thereby enabling the cancellation of the flicker noise during the integration phase.

At time $t_4$, clock waveform φ2 456 cycles to the off state, while φ2d 458 remains in the on state. Clock waveforms φ1 452 and φ1d 454 remain in the off state. In response to the off state of φ2 456, switches S6 426 and S7 432 open. Opening switch S6 426 breaks the circuit between the first input 446 i.e., Vp and inverting terminal 438 of the operational amplifier 408. This isolates the charge transferred to C4 434. Additionally, opening switch S7 432 breaks the circuit between Vn the second input 448 i.e., Vp and non-inverting terminal 440 of the operational amplifier 408. This isolates the charge transferred to C3 436.

At time $t_5$, clock waveform φ2d 458 cycles to the off state. Clock waveforms φ1 452, φ1d 454 and φ2 456 remain in the off state. In response to the off state of φ2d 458, switches S3 414 and S4 416 open. By delaying the opening of switches S3 414 and S4 416 until after switches S7 432 and S6 426 have been opened, and thus isolating the charges stored on C4 434 and C3 436, the sampled signals are unaffected by the charge injections that occur after switches S6 426 and S7 432 have been opened.

At time $t_6$, clock waveforms φ1 452 and φ1d 454 cycle to the on state while the clock waveforms φ2 456 and φ2d 458 remain in the off state. The response of the network 400 to the on state of φ1 452 and φ1d 454 is identical to the response to the on state at time $t_0$ as explained above. Likewise, at times subsequent to $t_6$, network 400 operates in the manner explained above.

Figure 4C:
FIG. 4c illustrates an example of amplitudes of a differential input signal during clock waveforms $\phi1$ and $\phi2$.
Figure 4D:
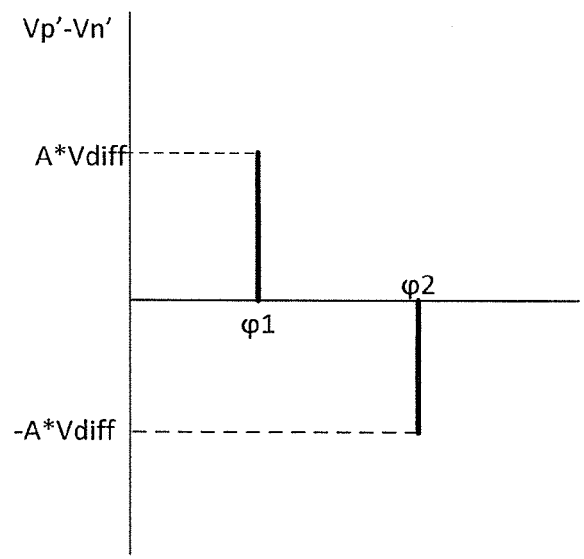
FIG. 4d illustrates an example of amplitudes of a differential output of the buffer amplifier during clock waveforms $\phi1$ and $\phi2$.
Figure 4E:
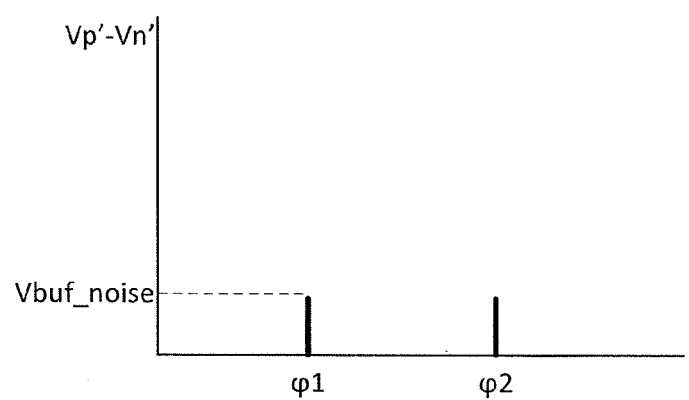
FIG. 4e illustrates an example of amplitudes of the differential buffer output low-frequency noise or offset during $\phi1$ and $\phi2$.

FIG. 4c illustrates the amplitude Vdiff (i.e., Vp-Vn), of the differential input signal at the first phase φ1 and the second phase φ2. Since the sampling frequency is much higher than the frequency of the input signal, the amplitude of the differential input signal does not change much between φ1 and φ2, as is shown in FIG. 4c. FIG. 4d illustrates the amplitudes of the differential output of the driver amplifier during φ1 and φ2. Since the differential input signal is sampled with opposite polarities in the first phase of operation φ1 and the second phase of operation φ2, the differential output of the driver amplifier has opposite polarities (i.e., A*Vdiff at φ1 and −A*Vdiff at φ2, where A is the gain of the driver amplifier) in the first phase of operation φ1 and the second phase of operation φ2. Similarly, FIG. 4e illustrates the amplitudes of the differential driver amplifier output flicker noise and offset during φ1 and φ2. Since the driver amplifier flicker noise and offset are sampled with the same polarity in the first phase of operation φ1 and the second phase of operation φ2, the differential driver amplifier output flicker noise and offset have the same polarity (i.e., Vbuf_noise) in the first phase of operation φ1 and the second phase of operation φ2. The amplitude of the flicker noise is approximately equal in φ1 and φ2, because flicker noise is a low-frequency noise. The clock frequency for the oversampling ADCs is usually much higher that the corner frequency of the flicker noise.

Figure 5:
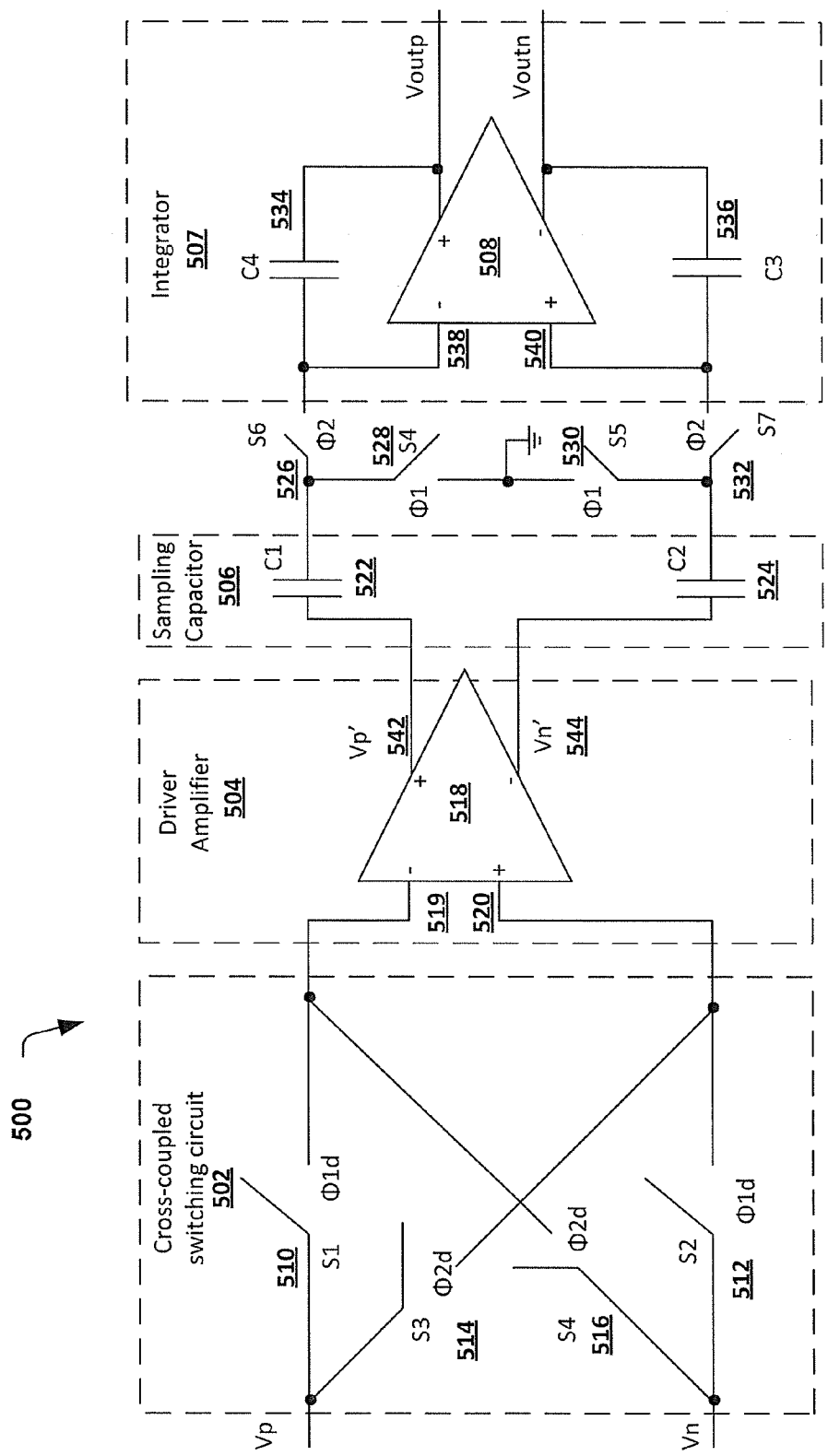
FIG. 5 illustrates another schematic diagram a fully differential switched capacitor integrator with a fully differential buffer amplifier, according to another embodiment of the present disclosure.

FIG. 5 shows another embodiment of a switched capacitor sampling network 500, similar to the switched capacitor sampling network 400. However, the driver amplifier system 504 comprises a fully differential driver amplifier 518 having two differential inputs 519 and 520 and two differential outputs 542 and 544. The analysis for the switched capacitor sampling network 500 is similar to that explained above for the switched capacitor sampling network 400.

Figure 6:
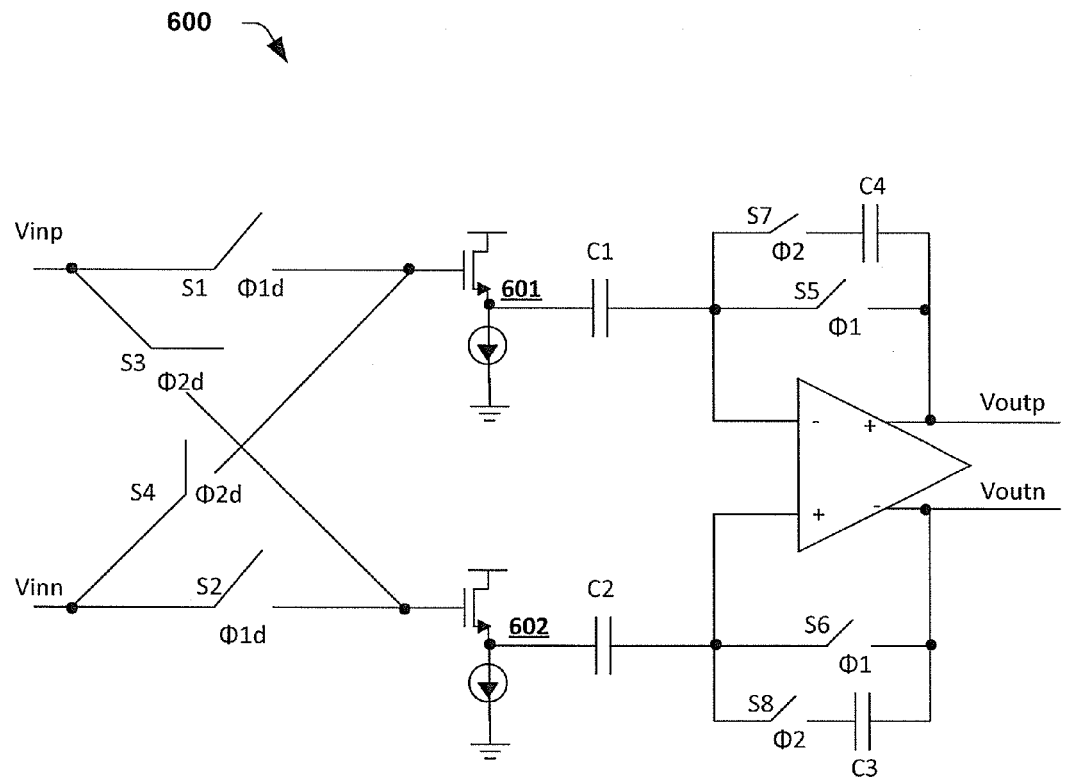
FIG. 6 illustrates another schematic diagram of a fully differential switched capacitor integrator with buffer amplifiers implemented as source followers, according to the present disclosure.

FIG. 6 shows an example embodiment, wherein the switched capacitor sampling network 600, similar to the switched capacitor sampling network 400, is having their driver amplifiers implemented as source followers 601 and 602. The analysis for the switched capacitor sampling network 600 is similar to that explained above for the switched capacitor sampling network 400. The integrator implementation in FIG. 6 has an advantage in comparison to the integrator in FIG. 4a and FIG. 5 because it comprises a flicker noise cancellation of the internal flicker noise of the integrator. S5 and S6 sample the flicker noise of the integrator amplifier and differential input signal during φ1. S7 and S8 enable integration of the inverted differential input signal and cancellation of the integrator flicker noise during φ2. In other embodiments, the switched capacitor integrator could be implemented with other techniques for cancellation or reduction of its internal flicker noise.

Figure 7:
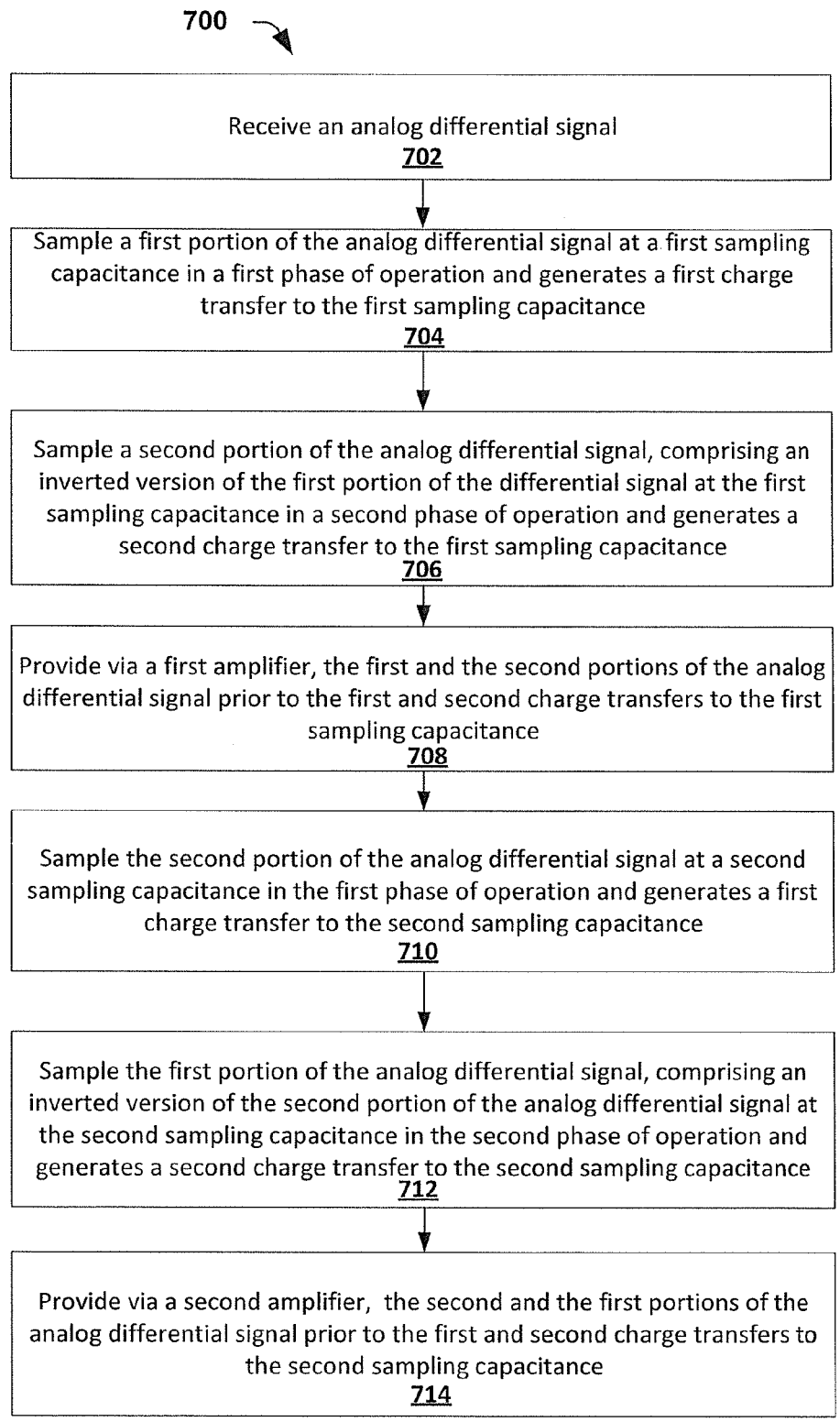
FIG. 7 illustrates a flowchart of a method of sampling a differential signal, according to an embodiment of the present disclosure.

FIG. 7 shows a flowchart illustrating a method 700 for sampling a differential signal, according to one embodiment of the disclosure. The method 700 is described here with reference to the switched capacitor sampling network 400 of FIG. 4a with a first driver amplifier Bufp 418 and a second driver amplifier Bufn 420, however, the method can also be applied to other switched capacitor sampling networks with a fully differential driver amplifier, as illustrated in FIG. 5.

In the method 700, at 702, the analog differential signal 405 is received at the first input 446 and second input 448 of a cross-coupled switching circuit 402. At 704, a first portion Vp of the analog differential signal 405 from the first input 446 is sampled at a first sampling capacitance C1 422 in a first phase of operation and generates a first charge transfer to the first sampling capacitance C1 422. At 706, a second portion Vn of the analog differential signal 405, comprising an inverted version of the first portion Vp of the analog differential signal 405 is sampled at the first sampling capacitance C1 422 in a second phase of operation, resulting in a second charge transfer to the first sampling capacitance C1 422. At 708, the first portion Vp and the second portion Vn of the analog differential signal 405 is provided through the driver amplifier 418, prior to the first and second charge transfers to the first sampling capacitance C1 422.

At 710, the second portion Vn of the analog differential signal 405 from the second input 448 is sampled at the second sampling capacitance C2 424 in a first phase of operation and generates a first charge transfer to the second sampling capacitance C2 424. At 712, the first portion Vp of the analog differential signal 405, comprising an inverted version of the second portion Vn of the analog differential signal 405 is sampled at the second sampling capacitance C2 424 in a second phase of operation, resulting in a second charge transfer to the second sampling capacitance C2 424. At 714, the second portion Vn and the first portion Vp of the analog differential signal 405 is provided through the driver amplifier 420, prior to the first and second charge transfers to the second sampling capacitance C2 424.

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

As highlighted above, the switched capacitor sampling network having the buffer amplifier system downstream of the cross-coupled sampling circuit has many advantages. Providing the buffer amplifier downstream of the cross-coupled sampling circuit provides reduced resistance in series with the sampling capacitance and provides an isolation of the sampling capacitors from the input signal source, reducing the load for the input source. In addition, the efficient flicker noise cancellation enables reduced design requirements for the internal flicker noise of the driver amplifier, thereby making it possible to choose relatively small input transistor dimensions in order to reduce the switched capacitive load for the input signal source. The suppression of the flicker noise enables the optimization of the driver amplifier towards low thermal noise, while maintaining small input capacitance.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

The invention claimed is:
1. A switched capacitor system comprising:
 a switching stage comprising a plurality of switches configured to receive a differential signal at an input of the switching stage and provide a non-inverted version of the differential signal at an output of the switching stage during a first phase of operation and an inverted version of the differential signal at the output of the switching stage during a second phase of operation;

a driver stage comprising a first amplifier, the driver stage located downstream of the switching stage;

a sampling capacitor stage configured to sample an output of the driver stage during the first phase of operation and an output of the driver stage the second phase of operation;

a switching controller configured to control a cross coupled configuration of the plurality of switches in order to select the first or second phase of operation; and an integrator circuit coupled to an output of the sampling capacitor stage, wherein the integrator circuit comprises first and second feedback paths connected in parallel between a first input and a first output of the integrator circuit, wherein the first feedback path is configured to sample a portion of a sampling capacitor output signal in the first phase of operation and the second feedback path is configured to integrate a portion of a further sampling capacitor output signal in the second phase of operation.

2. The system of claim 1, wherein the first amplifier of the driver stage is located downstream of a first branch of the output of the switching stage, and the driver stage further comprises a second amplifier located downstream of a second branch of the output of the switching stage; and wherein the sampling capacitor stage comprises a first sampling capacitor coupled to an output of the first amplifier and a second sampling capacitor coupled to an output of the second amplifier.

3. The system of claim 2, wherein the switching stage comprises a first switch between a first signal pathway configured to communicate a first portion of the differential signal and an input of the first amplifier, and a second switch between a second signal pathway configured to communicate a second portion of the differential signal and an input of the second amplifier.

4. The system of claim 3, wherein the switching stage further comprises a third switch between the first signal pathway and the input of the second amplifier, and a fourth switch between the second signal pathway and the input of the first amplifier, wherein the third switch and the fourth switch are configured to cross-couple the first signal pathway and the second signal pathway to the input of the second amplifier and to the input of the first amplifier, respectively.

5. The system of claim 4, wherein the first feedback path comprises a first feedback switch configured to be selectively activated by a first feedback control signal from the switching controller.

6. The system of claim 5, wherein the second feedback path comprises an integrating capacitor connected in series with a second feedback switch configured to be selectively activated by a second feedback control signal from the switching controller.

7. The system of claim 6, wherein the integrator circuit further comprises third and fourth feedback paths in parallel between a second input and a second output of the integrator circuit.

8. The system of claim 7, wherein the third feedback path comprises a third feedback switch and the fourth feedback path comprises a fourth feedback switch in series with a second integrating capacitor, respectively.

9. The system of claim 8, wherein the switching controller is configured to activate the first switch, the second switch, the first feedback switch and the third feedback switch in the first phase of operation, while the third switch and the fourth switch are inactivated.

10. The system of claim 9, wherein the switching controller is further configured to delay a deactivation of the first switch and the second switch of the switching stage with respect to the deactivation of the first feedback switch and the third feedback switch during the first phase of operation.

11. The system of claim 8, wherein the switching controller is configured to activate the third switch, the fourth switch, the second feedback switch and the fourth feedback switch in the second phase of operation, while the first switch and the second switch are inactivated.

12. The system of claim 11, wherein the switching controller is further configured to delay a deactivation of the third switch and the fourth switch of the switching stage with respect to the deactivation of the second feedback switch and the fourth feedback switch during the second phase of operation.

13. The system of claim 1, wherein the first feedback path comprises a first feedback switch configured to be selectively activated by a first feedback control signal from the switching controller.

14. The system of claim 1, wherein the second feedback path comprises an integrating capacitor connected in series with a second feedback switch configured to be selectively activated by a second feedback control signal from the switching controller.

15. The system of claim 1, wherein the switching controller is configured to delay a deactivation of one or more switches in the switching stage with respect to a deactivation of one or more switches in the sampling capacitor stage.

16. The system of claim 1, wherein the switching controller is configured to delay a deactivation of one or more switches in the switching stage with respect to a deactivation of one or more switches in the integrator circuit.

* * * * *